United States Patent
Gancarz

(10) Patent No.: US 10,444,364 B2
(45) Date of Patent: Oct. 15, 2019

(54) PINNED PHOTODIODE PIXELS INCLUDING CURRENT MIRROR-BASED BACKGROUND LIGHT SUPPRESSION, AND IMAGING DEVICES INCLUDING THE SAME

(71) Applicant: ams Sensors Singapore Pte. Ltd., Singapore (SG)

(72) Inventor: Radoslaw Marcin Gancarz, Adliswil (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 116 days.

(21) Appl. No.: 15/598,598

(22) Filed: May 18, 2017

(65) Prior Publication Data
US 2017/0339361 A1    Nov. 23, 2017

Related U.S. Application Data

(60) Provisional application No. 62/338,664, filed on May 19, 2016.

(51) Int. Cl.
| | |
|---|---|
| *G01S 17/89* | (2006.01) |
| *G01S 7/486* | (2006.01) |
| *G01S 7/487* | (2006.01) |
| *H04N 5/361* | (2011.01) |
| *H01L 27/146* | (2006.01) |
| *H04N 5/33* | (2006.01) |

(52) U.S. Cl.
CPC .............. *G01S 17/89* (2013.01); *G01S 7/487* (2013.01); *G01S 7/4863* (2013.01); *H04N 5/361* (2013.01); *H01L 27/14609* (2013.01); *H04N 5/33* (2013.01)

(58) Field of Classification Search
CPC ........ G01S 17/89; G01S 7/4863; G01S 7/487; H04N 5/361; H04N 5/33; H01L 27/14609
See application file for complete search history.

(56) References Cited

U.S. PATENT DOCUMENTS

| | | | |
|---|---|---|---|
| 4,147,992 A | 4/1979 | Davis | |
| 5,687,261 A | 11/1997 | Logan | |
| 5,852,771 A | 12/1998 | Jain et al. | |
| 6,169,453 B1 | 1/2001 | Milanesi et al. | |
| (Continued) | | | |

FOREIGN PATENT DOCUMENTS

| | | |
|---|---|---|
| DE | 197 04 496 | 2/2001 |
| DE | 100 39 422 | 8/2002 |
| (Continued) | | |

OTHER PUBLICATIONS

Möller, T., et al., "Robust 3D Measurement with PMD Sensors", *Proceedings in the 1st Range Imaging Research Day at ETH*(2005), pp. 13-906467 (14 pages).

*Primary Examiner* — Tony Ko
(74) *Attorney, Agent, or Firm* — Michael Best & Friedrich LLP

(57) ABSTRACT

An imaging device includes a focal plane array of demodulation pixel cells. Each of the demodulation pixel cells includes a pinned photodiode, demodulation gates operable to demodulate optical signals sensed by the pinned photodiode and to transfer accumulated photo-charges to a respective one of a multitude of sense nodes, a readout circuit operable selectively to read out signals from the sense nodes, and a background light suppression circuit including cross-coupled current mirrors.

20 Claims, 13 Drawing Sheets

(56) References Cited

U.S. PATENT DOCUMENTS

| | | |
|---|---|---|
| 6,327,389 B1 | 12/2001 | Thomas |
| 6,359,511 B1 | 3/2002 | Phanse et al. |
| 6,373,338 B1 | 4/2002 | Phanse et al. |
| 6,407,637 B1 | 6/2002 | Phanse et al. |
| 6,538,503 B2 | 3/2003 | Burt |
| 6,597,899 B2 | 6/2003 | Souetinov et al. |
| 6,642,793 B2 | 11/2003 | Phanse et al. |
| 6,919,549 B2 | 7/2005 | Bamji et al. |
| 7,030,697 B1 | 4/2006 | Pribytko et al. |
| 7,046,284 B2 | 5/2006 | Kozlowski et al. |
| 7,139,024 B2 | 11/2006 | Lu et al. |
| 7,157,685 B2 | 1/2007 | Bamji et al. |
| 7,176,438 B2 | 2/2007 | Bamji et al. |
| 7,449,955 B2 | 11/2008 | Shih |
| 7,507,947 B2 | 3/2009 | Bamji et al. |
| 7,574,190 B2 | 8/2009 | Xu et al. |
| 2004/0100626 A1 | 5/2004 | Gulden et al. |
| 2004/0212430 A1 | 10/2004 | Escobar-Bowser et al. |
| 2016/0172410 A1* | 6/2016 | Kurokawa ........ H01L 27/14643 257/42 |

FOREIGN PATENT DOCUMENTS

| | | |
|---|---|---|
| DE | 102004016626 | 10/2005 |
| DE | 102005056774 | 5/2007 |
| DE | 102014214733 | 7/2015 |
| EP | 2 012 101 | 1/2009 |
| EP | 1 753 129 | 7/2011 |
| EP | 1 614 159 | 2/2014 |
| WO | WO 95/35595 | 12/1995 |
| WO | WO 2004/027359 | 4/2004 |
| WO | WO 2009/135952 | 11/2009 |
| WO | WO 2011/020629 | 2/2011 |
| WO | WO 2016/016018 | 2/2016 |

* cited by examiner

PINNED PHOTODIODE PIXELS INCLUDING CURRENT MIRROR-BASED BACKGROUND LIGHT SUPPRESSION, AND IMAGING DEVICES INCLUDING THE SAME

CROSS-REFERENCE TO RELATED APPLICATION(S)

This application claims the benefit of priority of U.S. Provisional Patent Application No. 62/338,664, filed on May 19, 2016. The contents of the earlier application are incorporated herein by reference in their entirety.

FIELD OF THE DISCLOSURE

The present disclosure relates to pinned photodiode (PPD) pixels including current mirror-based background light suppression, and imaging devices including such pixels.

BACKGROUND

Many applications, such as robotics, biometrics, automobile security and navigation, medical imaging, surveillance, and others, require a three-dimensional ("3D") representation of the environment to avoid time-consuming processing steps required to ensure high quality of the specific task. Thus, real-time 3D-imaging has become an important challenge in the design of modern electronic image sensors. Optical systems can provide various advantages such as very fast 3D-data acquisition.

One type of device that has been used for photo-detection in the charge domain is a PPD. A pinned photodiode generally has two implants in the substrate, the doping concentrations of which are chosen in such a way that a fully depleted area is created beneath a very shallow non-depleted layer at the substrate surface. As shown, for example, in FIG. 1, the two implant steps include a deep n− implant 14 and a shallow p+ implant 16 (assuming a p-type substrate 12), where the p+ extends laterally beyond the n− layer in order to create an electrical connection to the substrate 12. At one side of the structure, a poly-silicon gate 18 is provided to enable the transfer of charges out of the PPD region 14 to a sense node diffusion 20. The pinned region 14 defines the photo-sensitive area 24 where photons are converted into electric charges. As long as the transfer gate 18 is set to low potential, the photo-generated charges are stored within the PPD region 14.

Electronic imaging sensors sometimes have an array of (m×n) photo-sensitive pixels, with x>1 rows and y>1 columns. Each pixel of the array can individually be addressed by dedicated readout circuitry for column-wise and row-wise selection. A block for signal post-processing may be integrated on the sensor. Demodulation pixels are a particular class of pixels that are useful for 3D imaging and other applications.

Background light (e.g., infrared radiation), however, can have a significant, adverse impact on imaging devices based on PPDs. For example, many 3D-camera systems operate in the non-visible, near-infrared region of the spectrum (e.g., 780 nm-900 nm). In this range of optical wavelengths, the maximal solar irradiance can amount, for example, to 1000 W/m$^2$/μm, which can result, in some cases, in millions of electrons being generated in addition to the signal-generated electrons. Thus, sensor-level background suppression techniques are generally needed.

SUMMARY

The present disclosure describes pinned photodiode pixels including current mirror-based background light suppression, and imaging devices including the such pixels.

For example, in one aspect, a demodulation pixel cell includes a pinned photodiode, demodulation gates operable to demodulate optical signals sensed by the pinned photodiode and to transfer accumulated photo-charges to a respective one of a multitude of sense nodes, a readout circuit operable to read out signals from the sense nodes, and a background light suppression circuit including cross-coupled current mirrors.

In another aspect, the disclosure describes an imaging device including a focal plane array of demodulation pixel cells. Each of the demodulation pixel cells includes a pinned photodiode, demodulation gates operable to demodulate optical signals sensed by the pinned photodiode and to transfer accumulated photo-charges to a respective one of a multitude of sense nodes, a readout circuit operable selectively to read out signals from the sense nodes, and a background light suppression circuit including cross-coupled current mirrors.

Some implementations include one or more of the following features. For example, in some instances, the current mirrors are operable to compensate for common mode current resulting from background light. Preferably, the photocurrent generated as a result of background light is split substantially evenly between the current mirrors. In some cases, the demodulation pixel cell includes circuitry operable to apply time domain current mirror chopping. In some instances, the circuitry operable to apply time domain current mirror chopping includes a cross-coupled chopping current mirror circuit. In some implementations, the cross-coupled chopping current mirror circuit is operable to apply time domain chopping to drains of transistors in the cross-coupled current mirrors. In some implementations, the cross-coupled chopping current mirror circuit is operable to apply time domain chopping to gates of transistors in the cross-coupled current mirrors.

Each one of the demodulation pixel cells further can include, in some instances, a charge exchange switch coupled to gates of transistors in the cross-coupled current mirrors. The charge exchange switch can be operable to be controlled by a clock signal different from clock signals that control switches of the circuitry operable to apply the time domain current mirror chopping.

In some cases, the cross-coupled chopping current mirror circuit includes a multitude of switches each of which is operable to respond, respectively, either to first or second clock signals that are phase-inverted with respect to one another. If a charge exchange switch is present, it can be controlled by a third clock signal different from the first and second clock signals.

In some instances, the readout circuit includes an output circuit coupled to the sense nodes and having a capacitance, each one of the demodulation pixel cells further being operable to alternate, from one integration period to the next, a phase of signals applied to the demodulation gates, and operable to change a polarity of connections for the capacitance.

Other aspects, features and advantages will be readily apparent from the following detailed description, the accompanying drawings, and the claims.

DETAILED DESCRIPTION

The present disclosure describes various techniques and circuits for providing background light suppression for a PPD pixel. The background light may include, for example, ambient light, sunlight and/or other unmodulated light.

Figure 1:
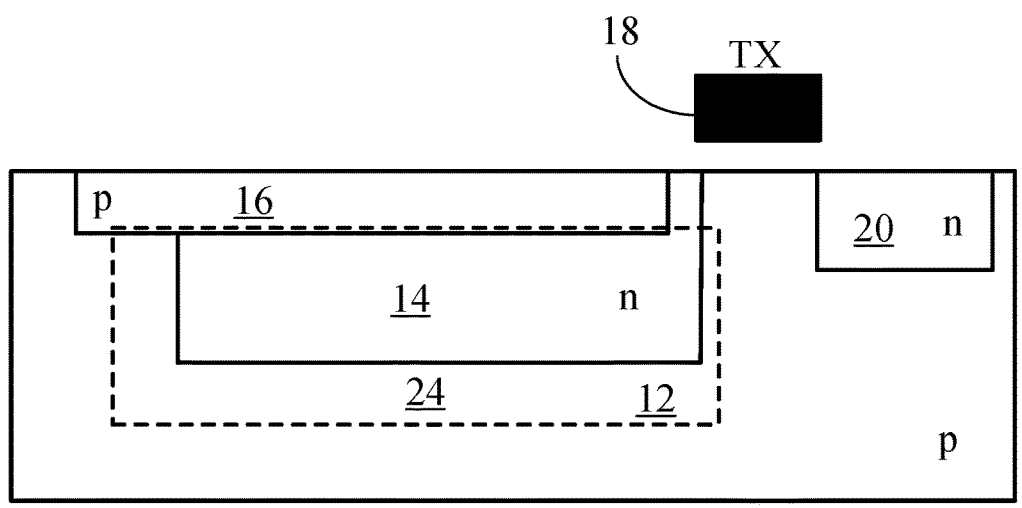
FIG. 1 illustrates an example of a pinned photodiode pixel.
Figure 2A:
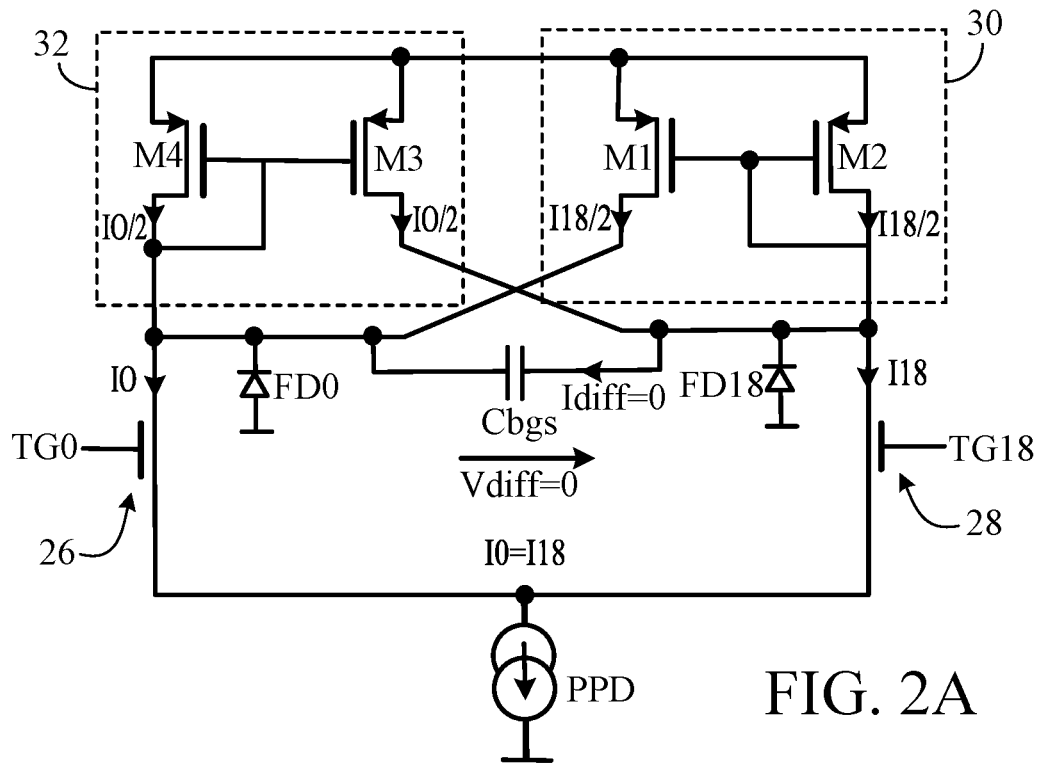
FIGS. 2A and 2B illustrate a simplified schematic of a PPD pixel including background light suppression.
Figure 2B:
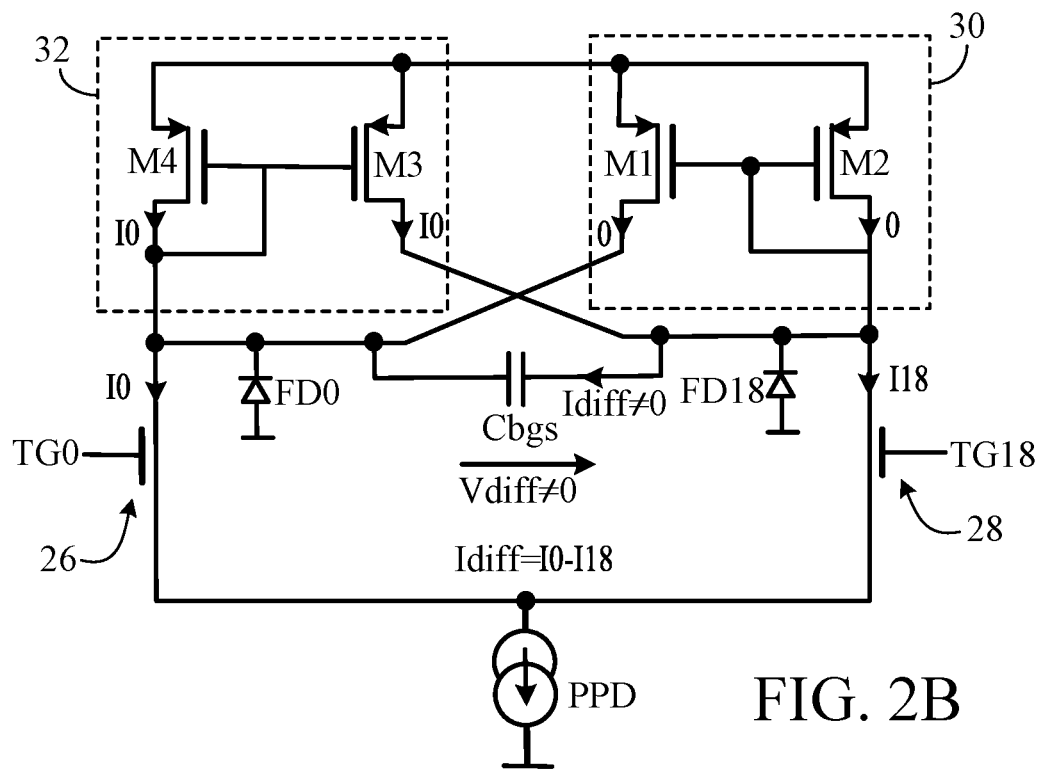

FIGS. 2A and 2B illustrate a simplified schematic of a PPD demodulation pixel 20 of a focal plane array of many such cells formed in an integrated circuit. As illustrated in the example PPD pixel of FIGS. 2A and 2B, toggle gates (i.e., switches) 26, 28 are provided to demodulate signals from the PPD. Control signals TG0, TG18 are applied to the demodulation gates 26, 28 such that the charge from the PPD is stored, respectively, in a first sense node diode FD0 during a first (e.g., 0°) demodulation phase, and in a second sense node diode FD18 during a second (e.g., 180°) demodulation phase. A single input clock signal, for example, can be used to generate the complementary toggle gate driving signals. Each of the sense node diodes FD0 and FD18 can be implemented, for example, as a floating diffusion region in a semiconductor substrate and serves as a sense node for the PPD pixel. The sense nodes can be coupled to output circuitry implemented, for example, as NMOS source follower field-effect transistors (FETs) having a capacitance shown in FIGS. 2A and 2B as Cbg (e.g., implemented as a metal stack capacitor). The source follower FETs, in turn, can be is connected to readout circuitry.

As further shown in FIGS. 2A and 2B, a pair of cross-coupled current mirrors 30, 32 provides background light suppression based on direct common mode compensation in the current domain. In the illustrated example, each of the current mirrors 30, 32 is composed of two PMOS transistors respectively (i.e., M1 and M2 for current mirror 30, and M3 and M4 for current mirror 32). The cross-coupled current mirrors 30, 32 are coupled to the capacitance Cgbs of the output circuit and to the sense node diodes FD0, FD18. Current that is generated as a result of background light is split substantially evenly between the current mirrors 30, 32, which compensate for the background current such that only the differential signal current appears across the output capacitance Cbgs. Thus, as indicated by FIG. 2A, if the signal-generated currents of the 0° and 180° phases are identical, the circuit remains in a balanced condition with the differential current equal to zero. On the other hand, as indicated by FIG. 2B, if the currents of the 0° and 180° phases differ, the circuit is in an unbalanced state, and the current difference is integrated across the capacitance Cbgs.

In either case, the current mirrors 30, 32 compensate for the common mode current resulting from the background light.

Figure 3:
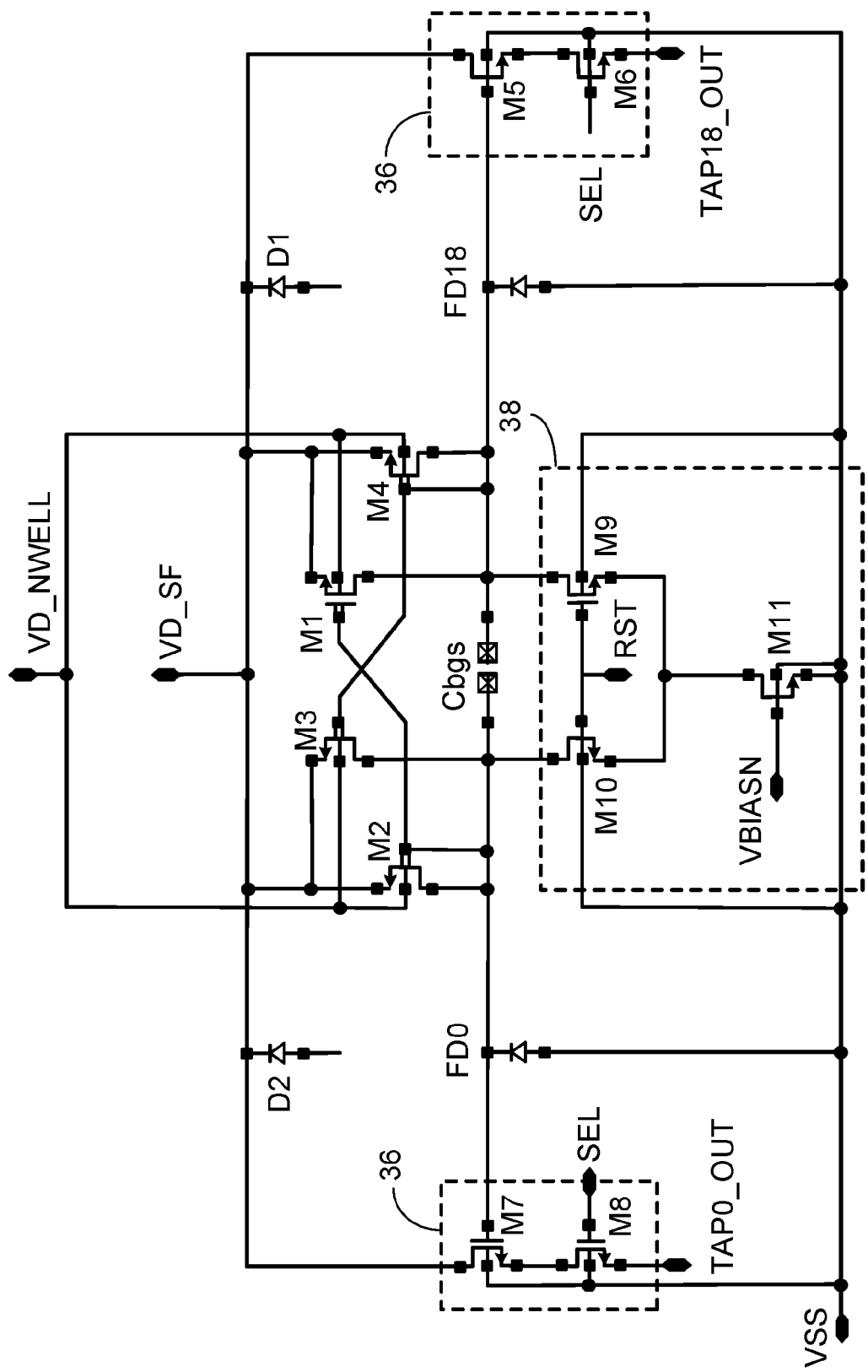
FIG. 3 illustrates further details of a pixel background light suppression and readout circuit.

FIG. 3 illustrates further details of a pixel background light suppression and readout circuit, including readout circuitry and reset circuitry. For ease of illustration, the demodulation gates 26, 28, as well as dump gates, are not shown in FIG. 3. Output and readout circuitry 36 coupled to the sense node FD0 (or FD18) includes, for example, an output circuit implemented as a source follower field-effect transistor (FET) M5 (or M7). Each sense node FD0 (or FD18) is connected to the gate of the source follower FET M5 (or M7), whose drain is connected to a main supply voltage (VD_SF). The source follower FET M5 (or M7) is connected to a row-select switch M6 (or M8) controlled by a signal (SEL) applied to its gate. The row-select switches M6 and M8 form part of the pixel's readout circuit. Although not shown in FIG. 3, each row-select switch M6 (or M8), in turn, can be coupled, for example, to a column-select switch and a correlated double sampling (CDS) amplifier operable to provide a correlated double sampling of the potential of the sense nodes FD0, FD18. The outputs in FIG. 3 are indicated, respectively, by TAP0_OUT and TAP18_OUT. During readout, signals are applied to CCD gates (TG_DUMP) associated with dump diffusion diodes D1, D2. The CCD gates transfer charge from the PPD region 14 to the main power supply (VD_SF) net during readout (i.e., while the TG0 and TG18 gates are off).

As further shown in FIG. 3, a reset circuit 38 includes reset switches M9, M10 and a current sink transistor M11. In operation, the background current suppression circuit should be balanced prior to a subsequent integration cycle. The reset switches M9, M10 and current sink transistor M11 serve this purpose. The reset switches M9, M10 equalize the potential across the capacitance Cbgs and pass some initial bias current, which provides some initial common mode voltage across the current mirror transistors M2 and M4 and places them into forward conduction. The reset switches M9, M10 are controlled by a signal (RST) applied to their gates. Likewise, the current sink transistor M11 has a bias voltage signal (VBIASN) applied to its gate. This bias voltage defines the reset current. The various switches in FIG. 3 can be implemented, for example, as FETs.

In the illustrated example, the power supply (VD_N-WELL) of the n-well for the current mirror transistors M1, M2, M3, M4 is separate from the main power supply (VD_SF). This feature allows the swing in the differential voltage to increase by applying a higher N-well potential so as to modulate the PMOS device threshold voltage. An alternative technique for increasing the differential is to provide an additional PMOS diode in series with the current mirrors 30, 32. Such an approach, however, tends to increases the overall layout size of the circuit and has less in swing adjustment.

Figure 4:
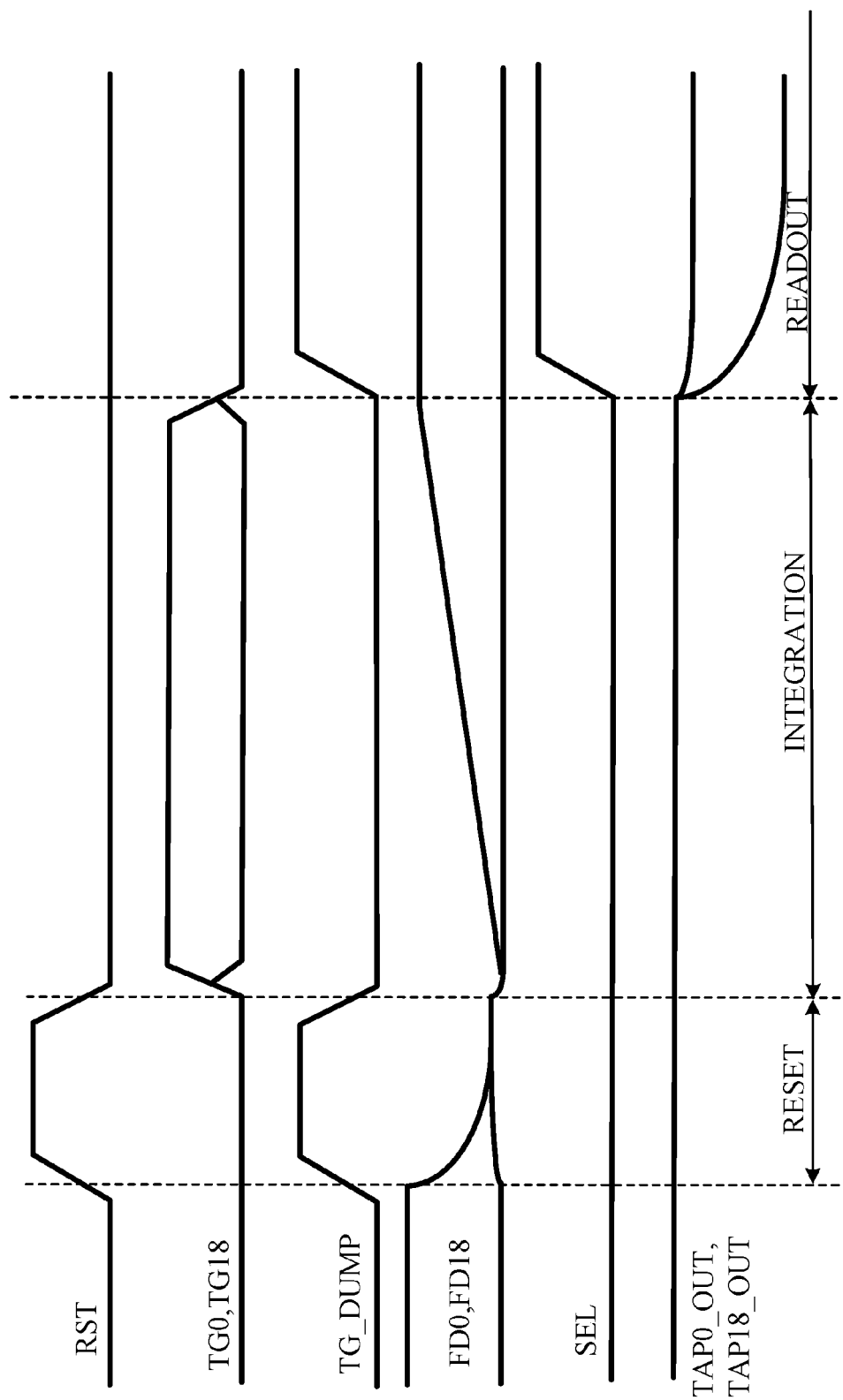
FIG. 4 is an example of a timing diagram for the circuit of FIG. 3.

FIG. 4 is a timing diagram showing examples of the input signals RST, TG0, TG18, TG_DUMP and SEL, as well as signals at the sense nodes FD0, FD18 and the output signals TAP0_OUT, TAP18_OUT, during pixel reset, pixel integration and pixel readout.

In some cases, as a result of an imperfect integrated circuit manufacturing process, a deviation between the real output current at the output nodes and the originally desired current may occur. Nevertheless, background light suppression can be improved even in the presence of such imperfect mirror current matching by applying time domain current mirror chopping.

Figure 5:
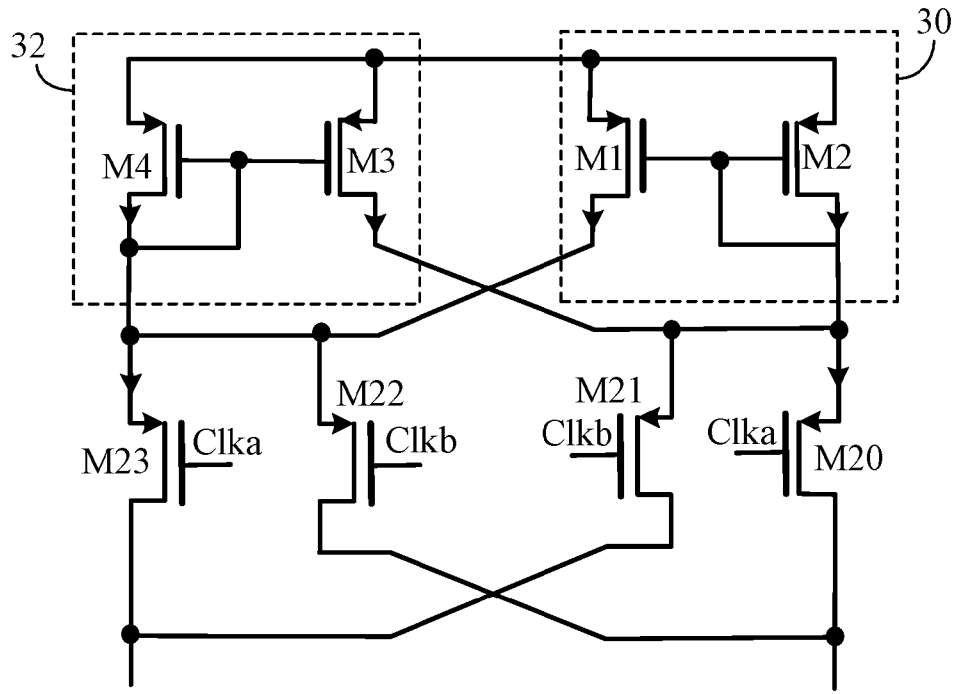
FIG. 5 illustrates a cross-coupled chopping current mirror configuration.

For example, as shown in FIG. 5, a cross-coupled chopping current mirror configuration can be provided by the addition of switches M20 through M23. By using a first clock signal Clka and a second clock signal Clkb, the transmission-gates of the circuit are controlled to be turned on or off. In particular, the first clock signal Clka and the second clock signal Clkb are phase-inverted with respect to one another. Thus, when the first clock signal Clka takes a logic-high level, the second clock signal Clkb takes a logic-low level. Likewise, when the first clock signal Clka takes a logic-low level, the second clock signal Clkb takes a logic-high level. The cross-coupled chopping current mirror thus is operable to average the currents of the channels.

Figure 6:
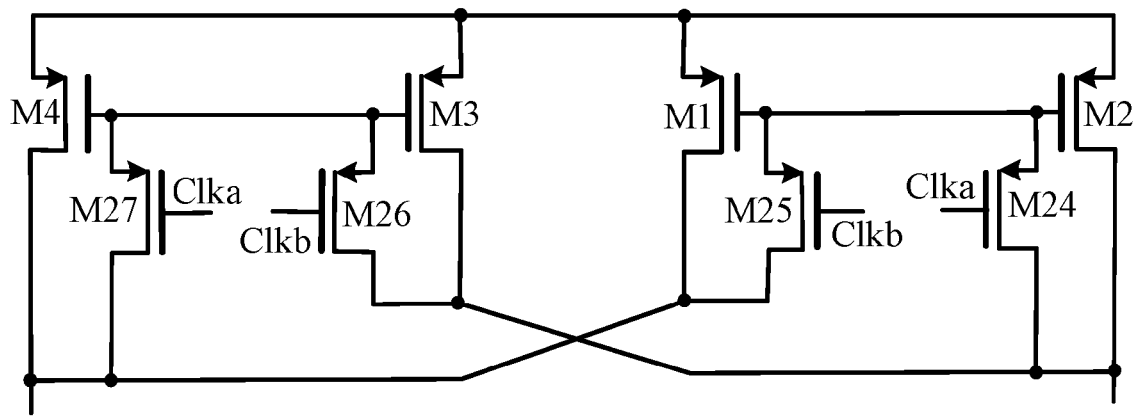
FIG. 6 illustrates another cross-coupled chopping current mirror configuration.

Instead of applying the time domain chopping to the drains of the current mirror switches M1-M4 as in FIG. 5, time domain chopping can be applied to their respective gates by the using switches M24-M27, as shown in the configuration of FIG. 6. Here too, the first clock signal Clka and the second clock signal Clkb are phase-inverted with respect to one another such that when the first clock signal Clka takes a logic-high level, the second clock signal Clkb takes a logic-low level, and vice-versa. In this case, however, DC current does not flow through the switches M24-M27.

Figure 7:
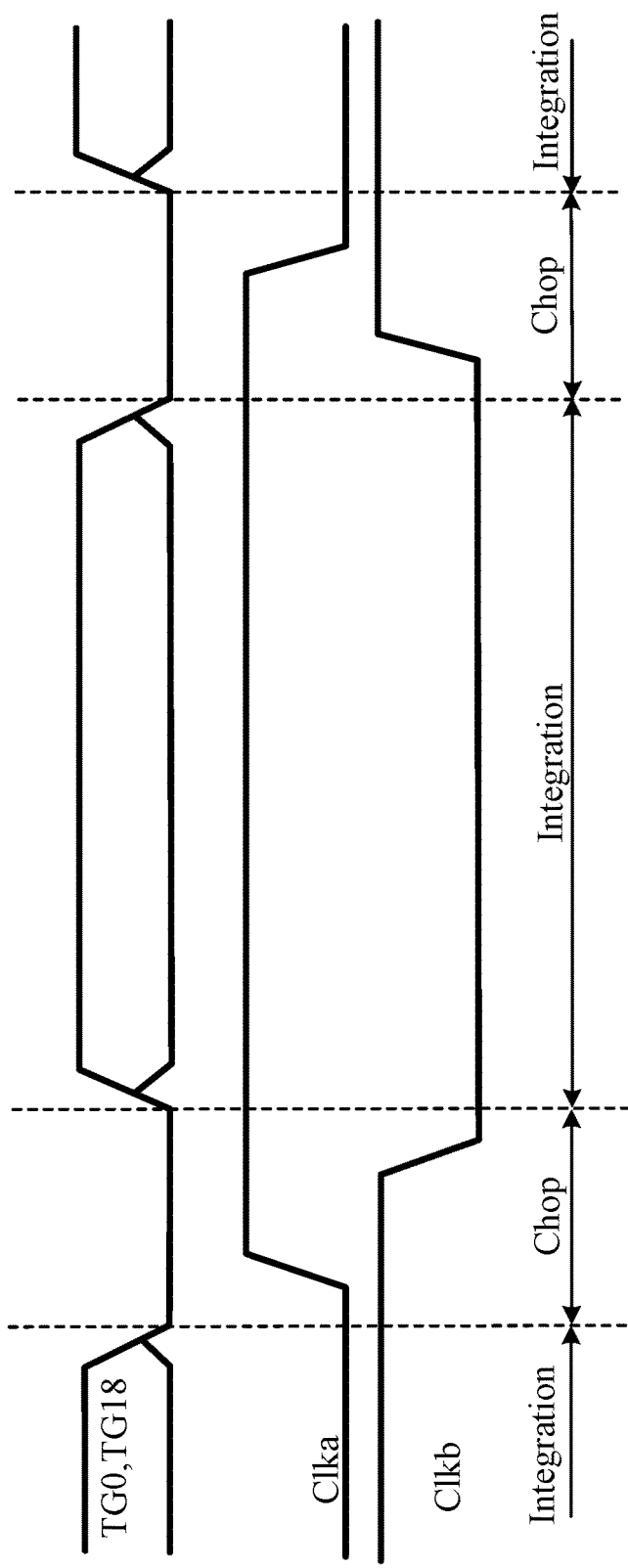
FIG. 7 is a timing diagram for the circuits of FIGS. 5 and 6.

FIG. 7 is a timing diagram for the chopping circuit clock signals Clka, Clkb of FIGS. 5 and 6, as well as the signals applied to the demodulation gates 26, 28, during pixel integration and chopping.

Figure 8:
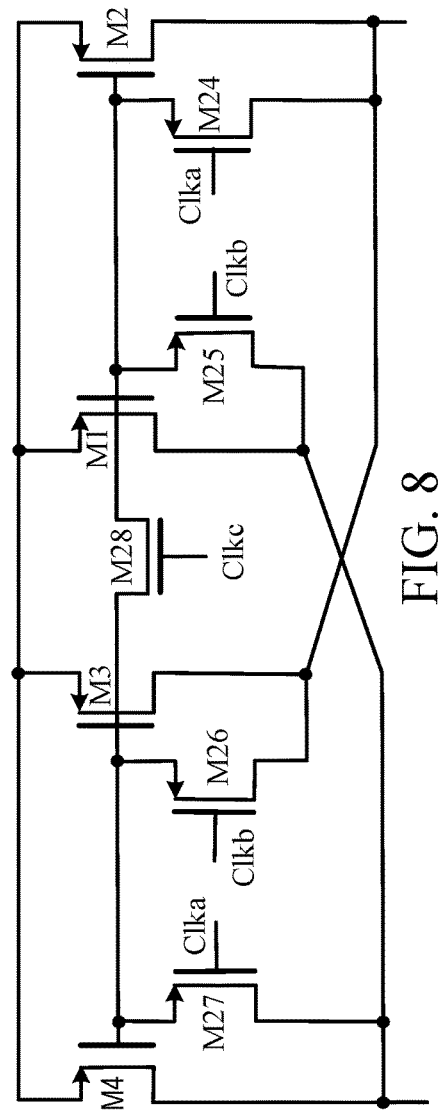
FIG. 8 illustrates a cross-coupled chopping current mirror configuration with charge exchange.
Figure 9:
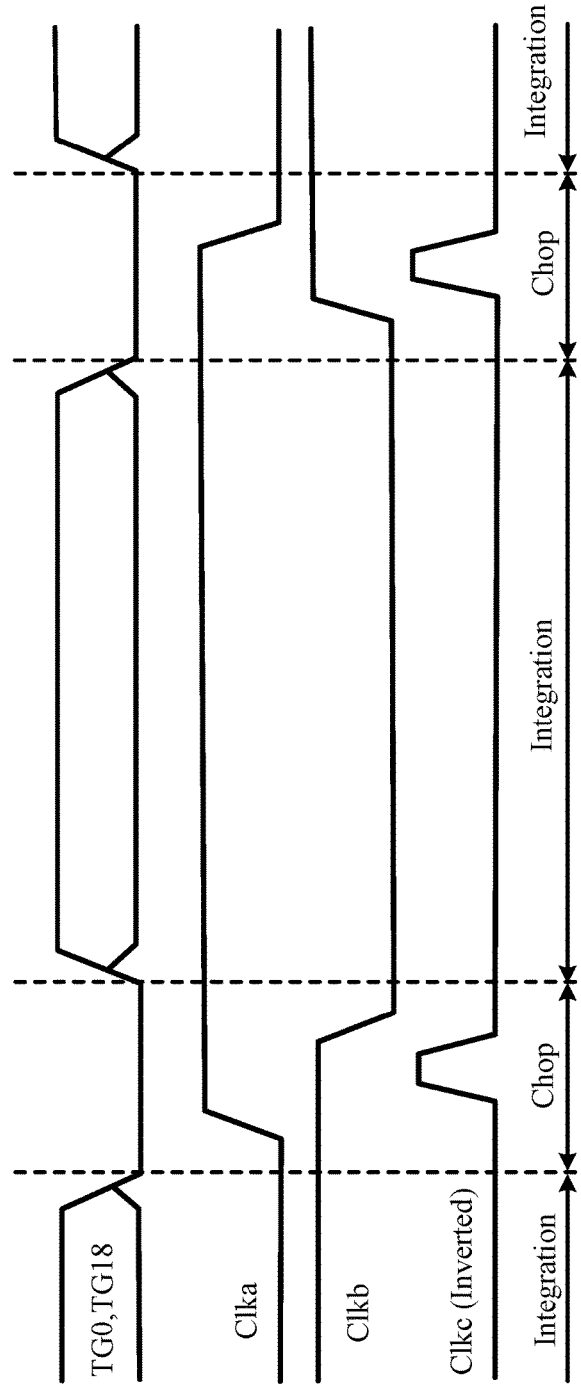
FIG. 9 is a timing diagram for the circuit of FIG. 8.

The foregoing approaches may cause charge loss as the gates of the mirror transistors M1-M4 are switched from one floating diffusion (i.e., sensing) node to another. Such charge loss can cause undesirable signal saturation at low currents. To alleviate such situations, a charge exchange switch M28, implemented for example as a FET transistor, can be coupled to the gates of the current mirror switches M1-M4 as show in FIG. 8. A third clock signal Clkc is applied to the gate of the charge exchange switch M28 such that the charge exchange switch M28 is open during chopping. FIG. 9 is a timing diagram showing an example of the clock signals Clka, Clkb, Clkc, as well as the signals TG0, TG18 applied to the demodulation gates 26, 28, during pixel integration and chopping for the configuration of FIG. 8.

Figure 10:
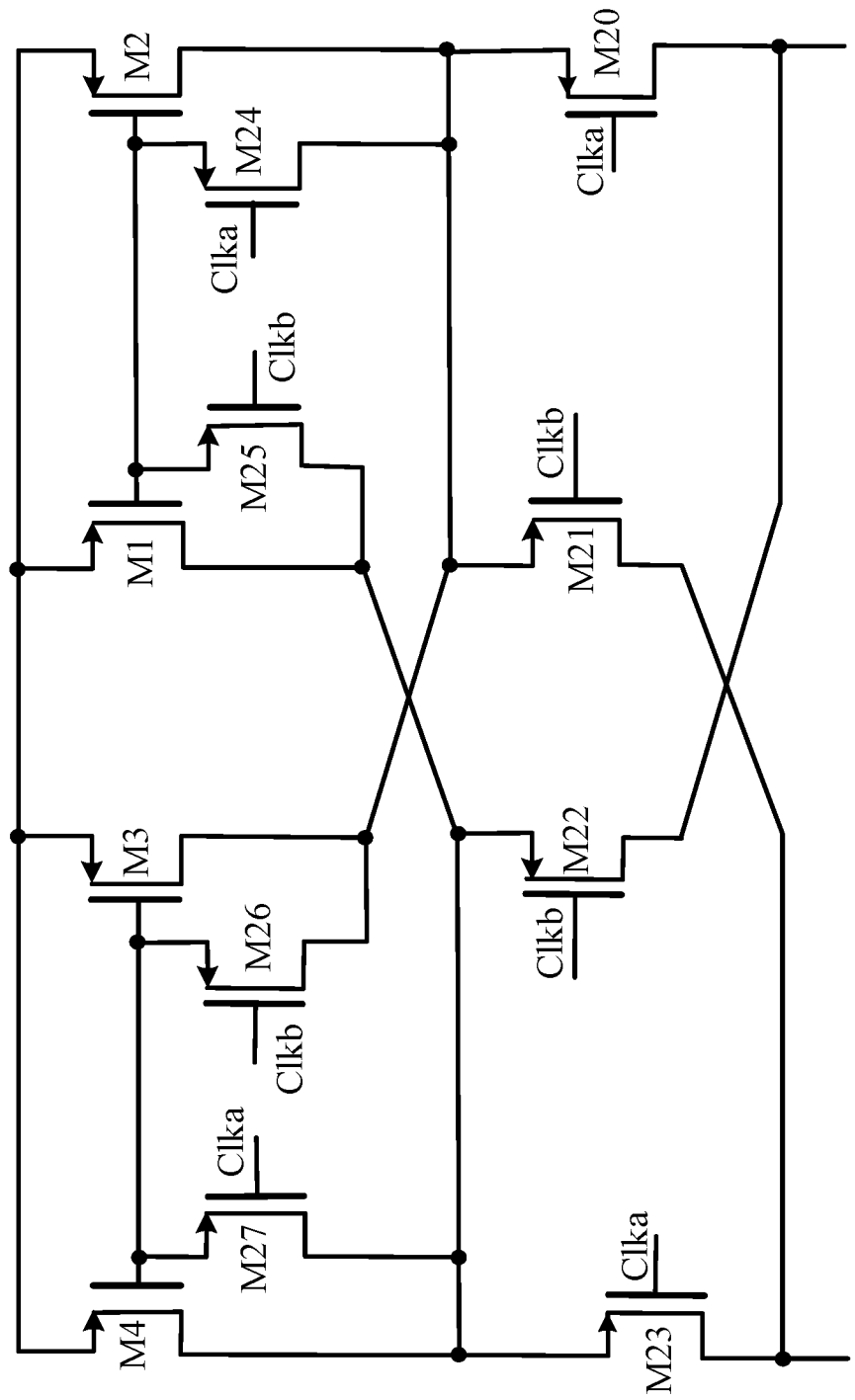
FIG. 10 illustrates another cross-coupled chopping current mirror configuration.

In some instances, it may be desirable to combine the configurations of FIGS. 5 and 6 so as to fully preserve the gate charges during chopping. Such a configuration is illustrated in FIG. 10, and allows time domain chopping to be applied to both the drains and gates of the current mirror switches M1-M4. In this case, the same two clock signal (Clka or Clkb) is applied to the drain and gate of each respective switch M1-M4. The timing diagram of FIG. 7 is applicable to this scenario as well.

Figure 11:
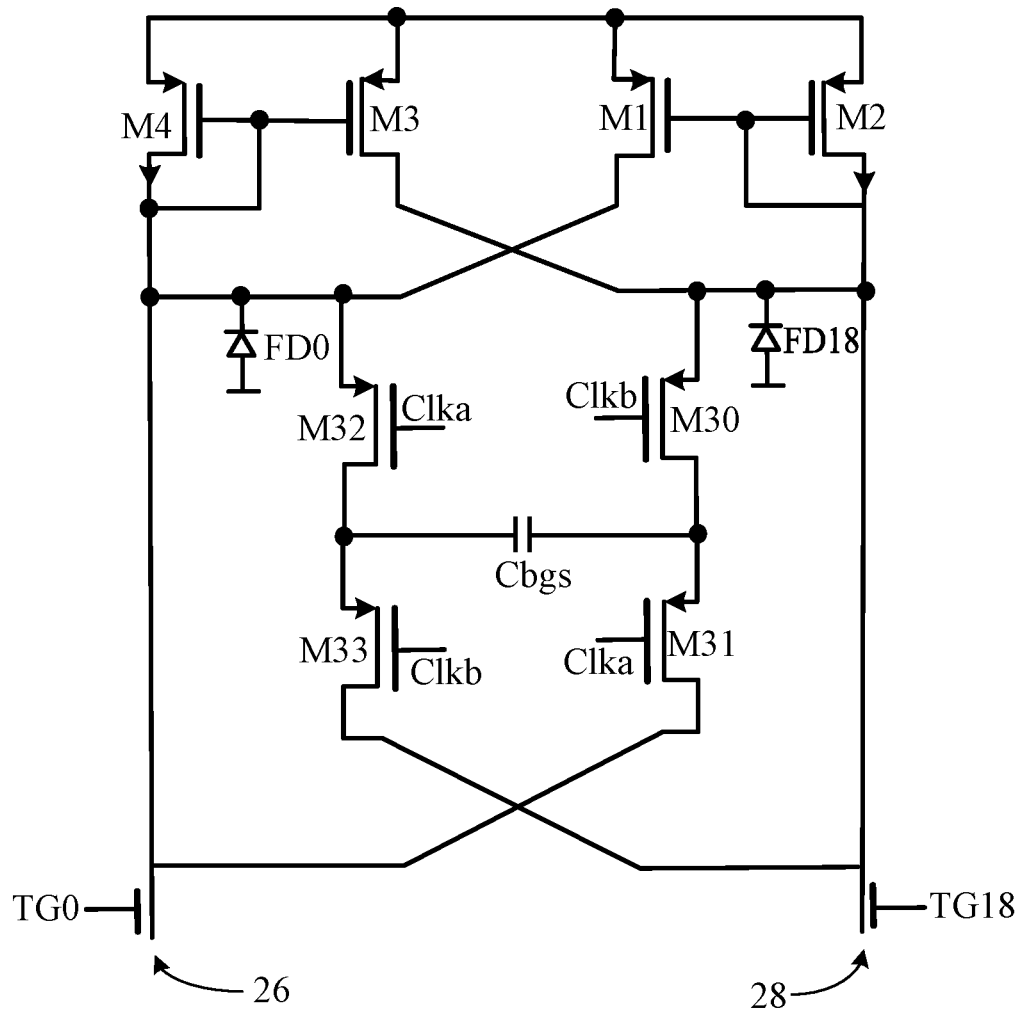
FIG. 11 illustrates the cross-coupled chopping current mirror configuration of FIG. 10 with charge exchange.
Figure 12:
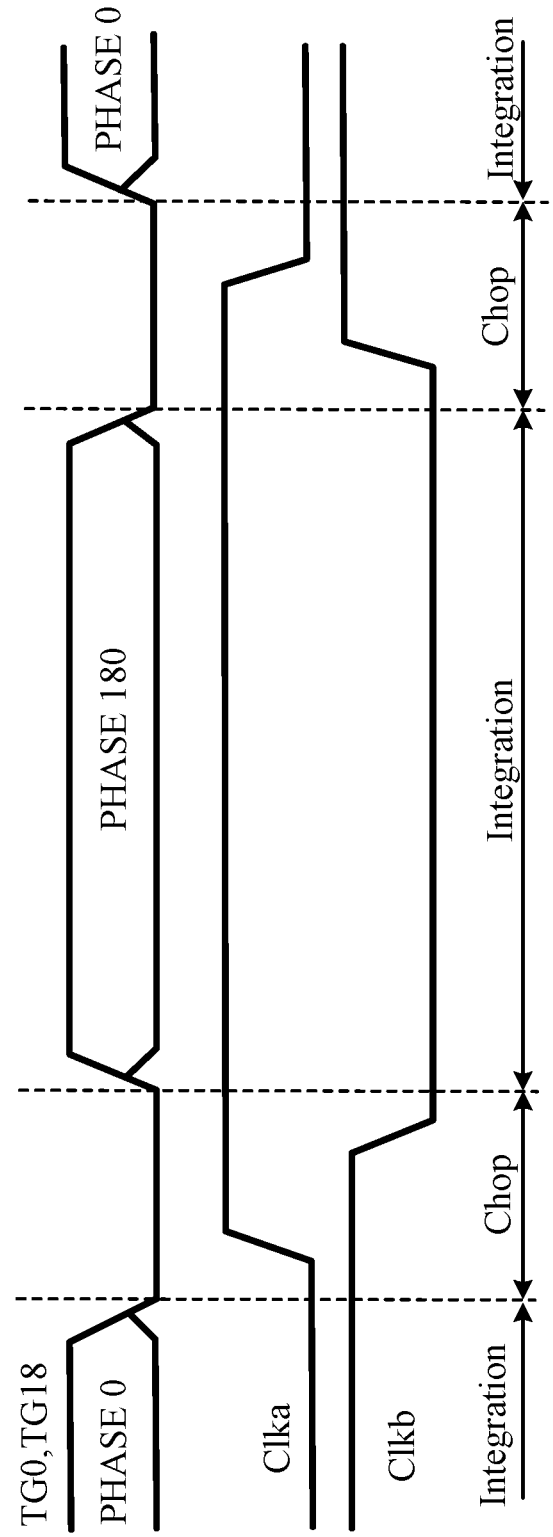
FIG. 12 is a timing diagram for the circuit of FIG. 11.

In the foregoing examples, time domain chopping is applied to the drains and/or gates of the current mirror switches M1-M4. As shown in FIG. 11, in some implementations, however, a different approach includes alternating the phase of the signals TG0, TG18 applied to the demodulation gates 26, 28 (e.g., switching the phase between 0° and 180°) from one pixel integration to the next and providing switches M30-M33 to change the polarity of the pins of the capacitance Cbgs. Thus, during a first pixel integration period, the capacitor pins have a first polarity and the phase of the signals applied to the demodulation gates is 0°. During the next, subsequent pixel integration period, the capacitor pins have a second, opposite polarity and the phase of the signals applied to the demodulation gates is 180°. This alternating sequence continues for subsequent pixel integration periods. FIG. 12 illustrates a timing diagram for such an implementation.

Figure 13:
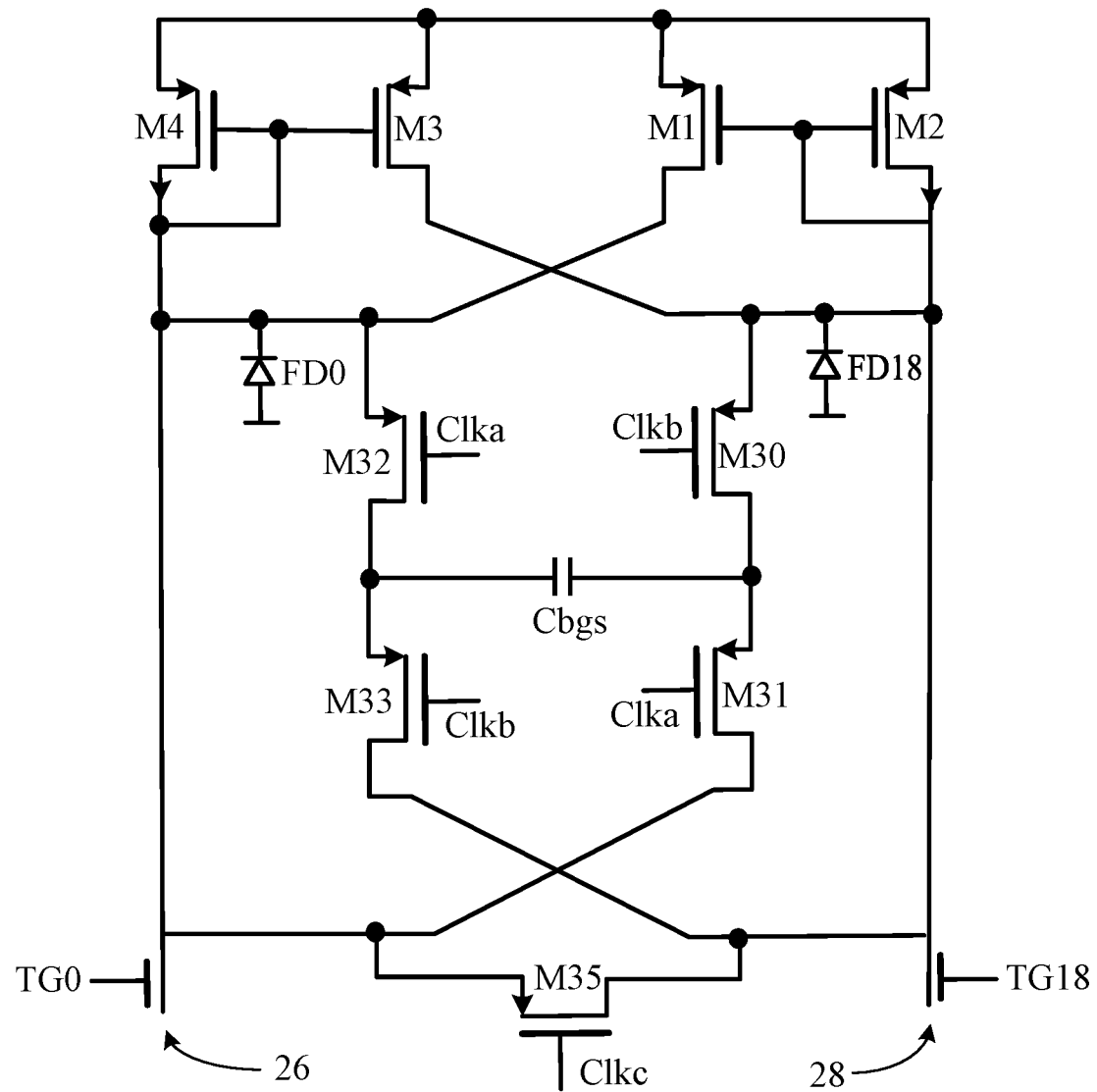
FIG. 13 illustrates another current mirror configuration.
Figure 14:
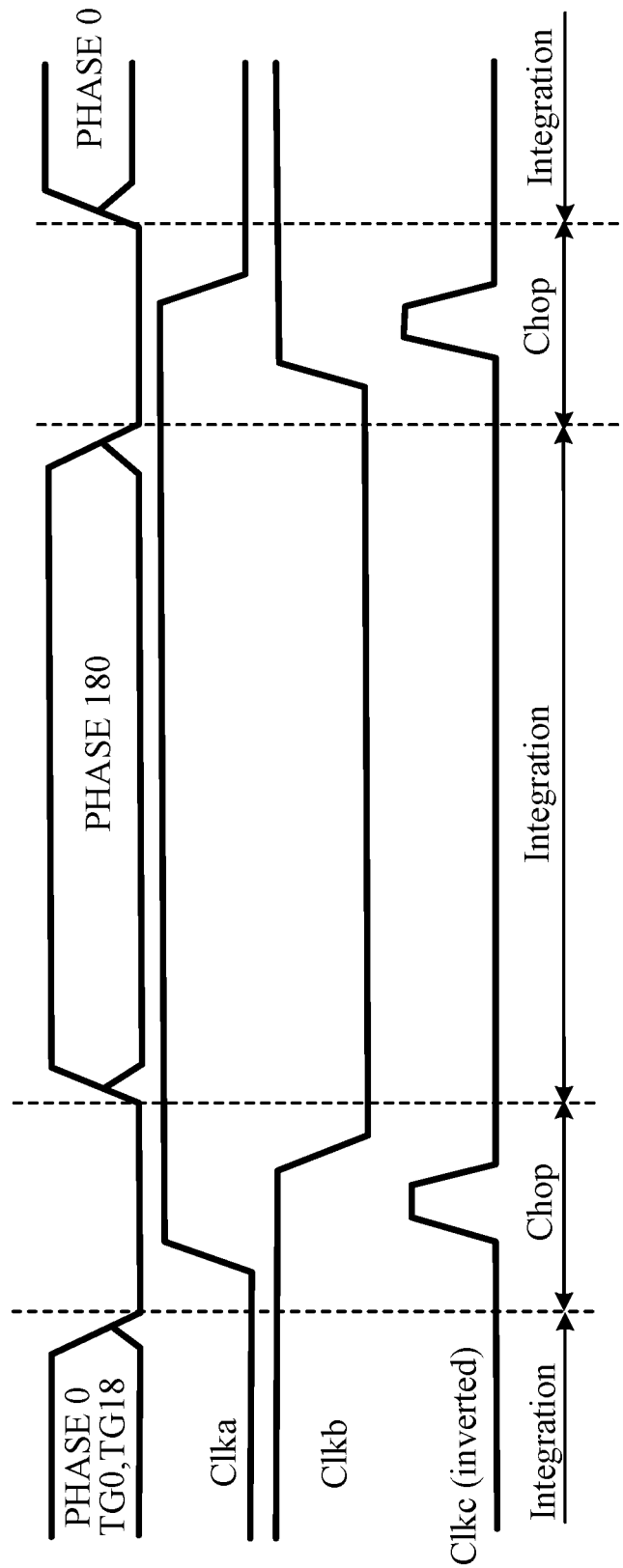
FIG. 14 is a timing diagram for the circuit of FIG. 13.

The configuration of FIGS. 11 and 12 can compensate for mismatch in the current mirrors 30, 32 as well as for asymmetries in the pixel sensitive area. Unfortunately, the charge placed on the gates of the current mirror switches M1-M4 and on the floating diffusion regions FD0, FD18 will be lost, which can result in high signal attenuation and saturation for low signals levels. To alleviate these issues, a charge exchange switch M35 can be added as shown in FIG. 13. A third clock signal Clkc is applied to the gate of the charge exchange switch M35. FIG. 14 is a timing diagram for such a configuration.

The electronic noise level can be limited, in some instances, by shortening the pixel integration time.

Figure 15:
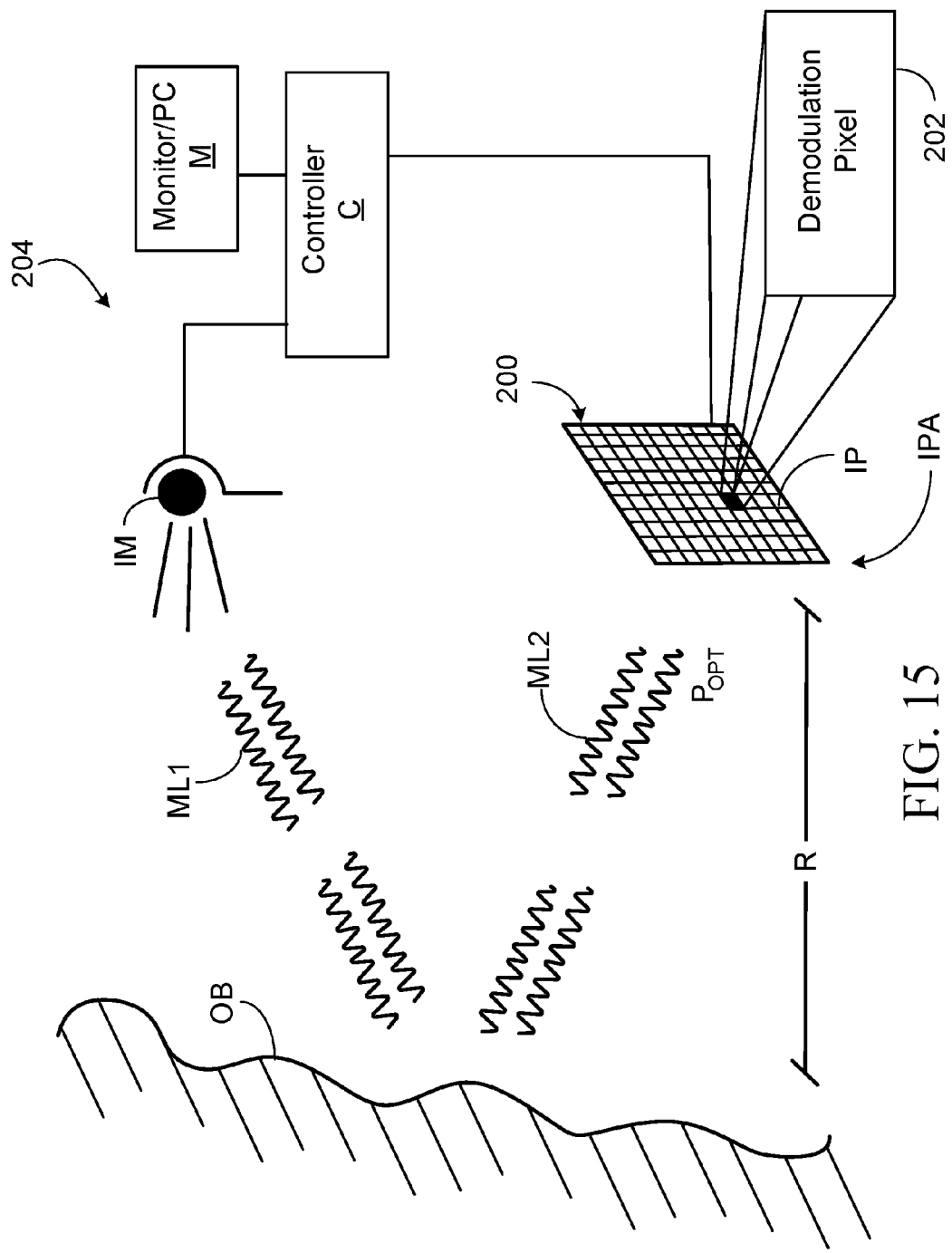
FIG. 15 is a block diagram of a three-dimensional camera system based on a sensor that includes an array of demodulation pixels.

A pixel including any of the foregoing background light suppression and readout circuits can be included in a focal plane array of many such pixels formed in an integrated circuit. FIG. 15 illustrates the basic principle of a 3D-measurement camera system based on a sensor 200 comprising an array of demodulation pixels 202 each of which can be similar to one of demodulation pixels described above. The camera system can be used advantageously, for example, in time-of-flight (TOF) and other applications.

Modulated illumination light ML1 from an illumination module or light source IM is sent to the object OB of a scene. In some instances, the light source generates modulated infra-red (IR) radiation. A fraction of the total optical power sent out is reflected to the camera 10 and detected by the 3D imaging sensor 200. The sensor 200 comprises a two dimensional pixel matrix of the demodulation pixels 202. Each pixel 202 is capable of demodulating the impinging light signal ML2 using known techniques. A control board CB is operable to regulate the timing of the camera 204. The phase values of all pixels correspond to the particular distance information of the corresponding point in the scene. The two-dimension gray scale image with the distance information is converted into a three-dimensional (e.g., depth) image by image processor IP. The image can be displayed to a user, for example, via display D or used as a machine vision input.

The distance R for each pixel can be calculated by R=(c·TOF)/2, with 'c' as light velocity and TOF corresponding to the time-of-flight. Either pulse intensity-modulated or continuously intensity-modulated light is sent out by the illumination module or light source IM, reflected by the object and detected by the sensor. With each pixel 202 of the sensor 200 being capable of demodulating the optical signal at the same time, the sensor is able to deliver 3D images in real-time, i.e., frame rates of up to 30 Hertz (Hz), or even more, are possible. In pulse operation, the demodulation would deliver the time-of-flight directly. However, continuous sine modulation delivers the phase delay (P) between the emitted signal and the received signal, also corresponding directly to the distance R=(P·c)/(4·pi·fmod), where fmod is the modulation frequency of the optical signal. Typical state-of-the-art modulation frequencies range from a few MHz up to a few hundreds of MHz or even GHz.

Various modifications can be made within the spirit of the foregoing disclosure. Accordingly, other implementations are within the scope of the claims.

What is claimed is:

1. An imaging device comprising a focal plane array of demodulation pixel cells, each of the demodulation pixel cells comprising:
   a pinned photodiode;
   demodulation gates operable to demodulate optical signals sensed by the pinned photodiode and to transfer accumulated photo-charges to a respective one of a plurality of sense nodes;
   a readout circuit operable selectively to read out signals from the sense nodes; and
   a background light suppression circuit including a plurality of cross-coupled current mirrors.

2. The imaging device of claim 1 wherein the background light suppression circuit is operable to provide background light suppression based on direct common mode compensation in current domain.

3. The imaging device of claim 1 wherein the current mirrors are operable to compensate for common mode current resulting from background light.

4. The imaging device of claim 1 wherein the current mirrors include current mirror transistors, and wherein a power supply for a well of the current mirror transistors is separate from a main power supply.

5. The imaging device of claim 1 wherein each one of the demodulation pixel cells further included circuitry operable to apply time domain current mirror chopping.

6. The imaging device of claim 5 wherein the circuitry operable to apply time domain current mirror chopping includes a cross-coupled chopping current mirror circuit.

7. The imaging device of claim 5 wherein the cross-coupled chopping current mirror circuit is operable to apply time domain chopping to drains of transistors in the cross-coupled current mirrors.

8. The imaging device of claim 5 wherein the cross-coupled chopping current mirror circuit is operable to apply time domain chopping to gates of transistors in the cross-coupled current mirrors.

9. The imaging device of claim 5 wherein each one of the demodulation pixel cells further includes a charge exchange switch coupled to gates of transistors in the cross-coupled current mirrors.

10. The imaging device of claim 9 wherein the charge exchange switch is operable to be controlled by a clock signal different from clock signals that control switches of the circuitry operable to apply the time domain current mirror chopping.

11. The imaging device of claim 5 wherein the cross-coupled chopping current mirror circuit is operable to apply time domain chopping to drains and gates of transistors in the cross-coupled current mirrors.

12. The imaging device of claim 11 wherein the cross-coupled chopping current mirror circuit includes a plurality of switches each of which is operable to respond, respectively, either to first or second clock signals that are phase-inverted with respect to one another.

13. The imaging device of claim 12 wherein each one of the demodulation pixel cells further includes a charge exchange switch coupled to the gates of the transistors in the cross-coupled current mirrors.

14. The imaging device of claim 13 wherein the charge exchange switch is controlled by a third clock signal different from the first and second clock signals.

15. The imaging device of claim 1 wherein the readout circuit includes an output circuit coupled to the sense nodes and having a capacitance, each one of the demodulation pixel cells further being operable to alternate, from one integration period to the next, a phase of signals applied to the demodulation gates, and operable to change a polarity of connections for the capacitance.

16. The imaging device of claim 15 wherein each one of the demodulation pixel cells further includes a charge exchange switch coupled to the gates of transistors in the cross-coupled current mirrors.

17. The imaging device of claim 1 operable such that photocurrent generated as a result of background light is split substantially evenly between the current mirrors.

18. A demodulation pixel cell comprising:
a pinned photodiode;
demodulation gates operable to demodulate optical signals sensed by the pinned photodiode and to transfer accumulated photo-charges to a respective one of a plurality of sense nodes;
a readout circuit operable to read out signals from the sense nodes; and
a background light suppression circuit including a plurality of cross-coupled current mirrors.

19. The demodulation pixel cell of claim 18 wherein the current mirrors are operable to compensate for common mode current resulting from background light.

20. The demodulation pixel cell of claim 18 including circuitry operable to apply time domain current mirror chopping.

* * * * *